(12) United States Patent
Maeda et al.

(10) Patent No.: US 11,199,773 B2
(45) Date of Patent: Dec. 14, 2021

(54) IMPRINT APPARATUS, IMPRINT METHOD, AND ARTICLE MANUFACTURING METHOD

(71) Applicant: CANON KABUSHIKI KAISHA, Tokyo (JP)

(72) Inventors: Toshihiro Maeda, Utsunomiya (JP); Osamu Yasunobe, Utsunomiya (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 16/804,933

(22) Filed: Feb. 28, 2020

(65) Prior Publication Data

US 2020/0285147 A1     Sep. 10, 2020

(30) Foreign Application Priority Data

Mar. 5, 2019  (JP) .............................. JP2019-039728

(51) Int. Cl.
*G03F 7/00*   (2006.01)
*B29C 33/42*  (2006.01)

(52) U.S. Cl.
CPC .......... *G03F 7/0002* (2013.01); *B29C 33/424* (2013.01); *B29C 2033/426* (2013.01)

(58) Field of Classification Search
CPC ........................ B29C 33/424; B29C 2033/426
See application file for complete search history.

(56) References Cited

U.S. PATENT DOCUMENTS

| | | | | |
|---|---|---|---|---|
| 2006/0157444 A1* | 7/2006 | Nakamura | ............ | G03F 7/0002 216/54 |
| 2006/0279022 A1* | 12/2006 | Seki | ...................... | B82Y 40/00 264/320 |
| 2008/0160129 A1* | 7/2008 | Resnick | ................. | B82Y 10/00 425/385 |
| 2012/0061875 A1* | 3/2012 | Kono | ..................... | B82Y 40/00 264/293 |
| 2013/0139713 A1* | 6/2013 | Cho | ........................ | B82Y 40/00 101/333 |
| 2014/0138875 A1* | 5/2014 | Torii | ..................... | G03F 7/0002 264/293 |

FOREIGN PATENT DOCUMENTS

JP      2008-504141 A     2/2008

* cited by examiner

*Primary Examiner* — Jacob T Minskey
*Assistant Examiner* — Virak Nguon
(74) *Attorney, Agent, or Firm* — Canon U.S.A., Inc. IP Division

(57) ABSTRACT

An imprint apparatus configured to form a pattern of an imprint material on a substrate using a mold includes a holding unit configured to hold the mold with a holding surface making contact with a first surface of the mold, a deformation unit configured to apply a force to the mold held at the holding surface to deform the mold, and a drive unit configured to move at least one of the mold held by the holding unit and the deformation unit to change a relative position between the mold held by the holding unit and the deformation unit. The drive unit changes a position where the deformation unit applies a force to the mold in a direction vertical to the first surface based on information about a position of a second surface on an opposite side of the first surface.

12 Claims, 11 Drawing Sheets

IMPRINT APPARATUS, IMPRINT METHOD, AND ARTICLE MANUFACTURING METHOD

BACKGROUND

Field of the Disclosure

The present disclosure relates to an imprint apparatus, an imprint method, and an article manufacturing method.

Description of the Related Art

Demand for miniaturization of semiconductor devices and micro electro mechanical systems (MEMS) is increasing. Thus, an attention is paid to a microfabrication technique as well as a conventional photolithography technique. The microfabrication technique is for molding an imprint material on a substrate to form a composite of the imprint material on the substrate. The microfabrication technique, which is also called an imprint technique, enables molding a fine structure of several nm order on the substrate.

One example of the imprint technique is a photo-curing method. In an imprint apparatus employing the photo-curing method, a photo-curable imprint material is first supplied to a shot region, which is an imprint region on the substrate. Then, a pattern portion of a mold (original) and the shot region are aligned with each other, and simultaneously the mold and the imprint material supplied to the substrate are brought into contact (mold-pressed) with each other. The imprint material is then filled in the mold. The imprint material is cured by irradiation with light, and the imprint material is released from the mold. Thus, a composite of the imprint material is formed on the substrate.

The imprint apparatus includes a mold correction mechanism that applies a force to a side surface of the mold to correct a shape of a pattern portion of the mold when the mold is brought into contact with the imprint material supplied to the substrate. The mold correction mechanism enables shape matching between the pattern portion of the mold and the shot region. Further, the fine structure of several nm order is formed on the substrate, and thus the pattern portion of the mold has to be corrected with higher accuracy of several nm or less in a case where the pattern portion of the mold is deformed by the mold correction mechanism.

Japanese Unexamined Patent Application Publication No. 2008-504141 discusses an apparatus that applies a force to a mold (template) and corrects a shape of the mold to eliminate magnification distortion caused on a pattern portion of the mold.

However, in the apparatus discussed in Japanese Unexamined Patent Application Publication No. 2008-504141, in a case where an error occurs in a mold dimension due to manufacturing, a position where the force is applied to the mold might shift due to this error. In this case, the mold shape is not accurately corrected, and thus the magnification distortion is likely to be incapable of being sufficiently eliminated.

SUMMARY

The present disclosure is directed to an imprint apparatus that can correct a mold shape more accurately, an imprint method, and an article manufacturing method.

According to an aspect of the present invention, an imprint apparatus configured to form a pattern of an imprint material on a substrate using a mold includes a holding unit configured to hold the mold with a holding surface making contact with a first surface of the mold, a deformation unit configured to apply a force to the mold held at the holding surface to deform the mold, and a drive unit configured to move at least one of the mold held by the holding unit and the deformation unit to change a relative position between the mold held by the holding unit and the deformation unit. The drive unit changes a position where the deformation unit applies a force to the mold in a direction vertical to the first surface based on information about a position of a second surface on an opposite side of the first surface.

Further features of the present disclosure will become apparent from the following description of exemplary embodiments with reference to the attached drawings.

DESCRIPTION OF THE EMBODIMENTS

Exemplary embodiments of the present invention will be described in detail below with reference to the drawings. The following exemplary embodiments refer to examples using an imprint apparatus. In the drawings, like members are denoted by like reference symbols, and overlapped description is omitted.

Figure 1:
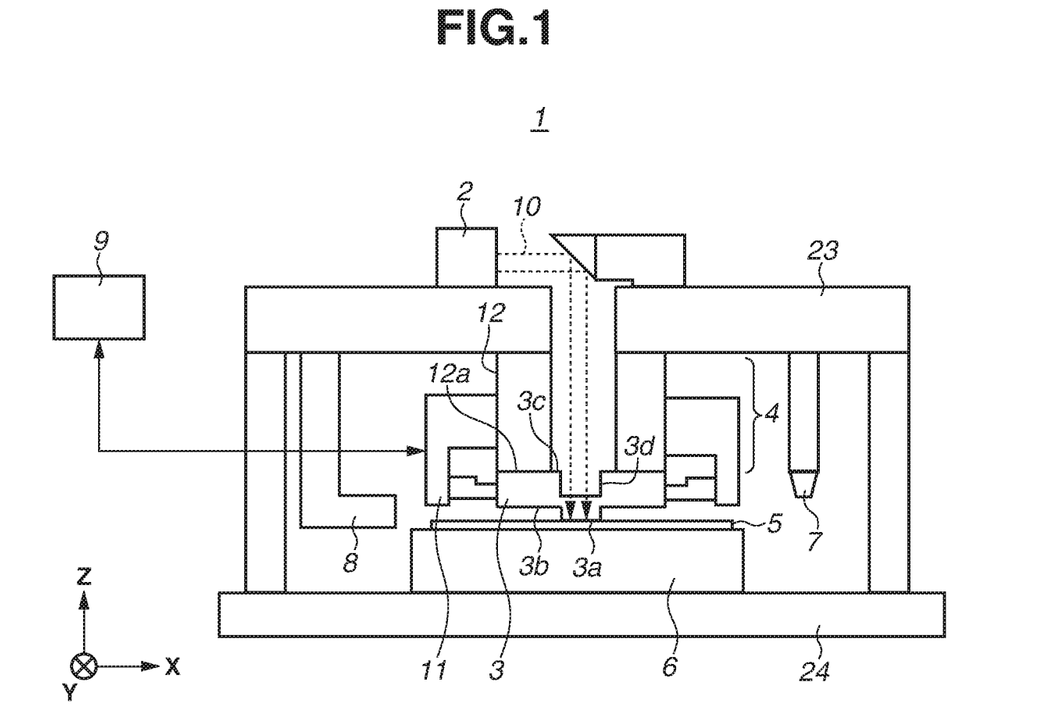
FIG. 1 is a diagram illustrating an imprint apparatus.

FIG. 1 is a diagram illustrating the imprint apparatus. An imprint apparatus 1 brings an imprint material supplied onto a substrate 5 into contact with a mold 3. A composite of a cured material to which a projection-and-recess pattern of the mold 3 is transferred is formed by supplying energy for curing to the imprint material.

A curable composite that is cured by supplying energy for curing (occasionally called an uncured imprint material) is used as the imprint material. An electromagnetic wave, heat, or the like is used as the energy for curing. The electromagnetic wave includes, for example, an infrared ray, visible light, and an ultraviolet ray whose wavelengths ranging between 150 nm and 1 mm inclusive.

The curable composite is a composite that is cured by irradiation with light or heating. A photo-curable composite, which is included in the curable composite and is cured by light, contains at least a polymerizable compound and photopolymerization initiator, and can contain a non-polymerizable compound or a solvent if necessary. As the non-polymerizable compound, at least one is selected from a group including a sensitizer, a hydrogen donor, an internal mold release agent, a surface active agent, an antioxidant, and a polymer component.

The imprint material is supplied onto the substrate in a form of a film by a spin coater or a slit coater. Alternatively, the imprint material can be supplied onto the substrate in a form of a droplet, or an island-shape or a film-shape formed by connecting a plurality of droplets by a liquid spray head. Viscosity (viscosity at 25° C.) of the imprint material is, for example, between 1 mPa·s and 100 mPa·s inclusive.

A first exemplary embodiment refers to the imprint apparatus 1 that employs a photo-curing method for curing the imprint material using irradiation with light. Further, in the following description, two directions are perpendicular to each other in a plane parallel with a holding surface where a mold holding unit 4, described below, holds the mold 3. The two directions are an X axis direction and a Y axis direction, respectively. A direction vertical to the holding surface of the mold holding unit 4 is a Z axis direction (vertical direction).

Figure 2:
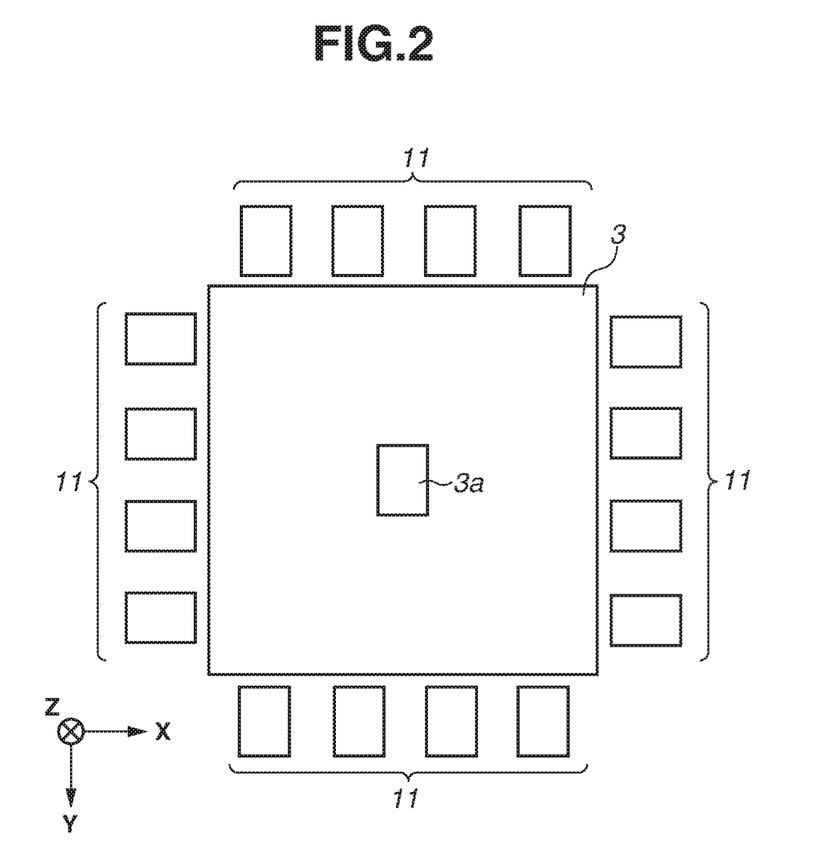
FIG. 2 is a plan view illustrating mold correction units.

Respective units of the imprint apparatus 1 will be described with reference to FIGS. 1 and 2. The mold holding unit 4 (holding unit) includes a mold chuck 12 and a mold moving mechanism (not illustrated). The mold chuck 12, which is fixed to a bridge surface plate 23, attracts to hold the mold 3 using a vacuum suction force or an electrostatic force. The mold moving mechanism moves the mold chuck 12 (the mold 3). The mold chuck 12 and the mold moving mechanism include an opening at a center portion (inside). The opening allows the imprint material on the substrate 5 to be irradiated with light 10. The mold chuck 12 holds the mold 3 in a state where a holding surface 12a is in contact with a first surface 3c of the mold 3. The mold moving mechanism moves the mold 3 in the Z axis direction. As a result, pressing of the mold 3 against the imprint material on the substrate 5 or release of the mold 3 from the imprint material on the substrate 5 is selectively performed. An actuator applicable to the mold moving mechanism includes, for example, a linear motor and an air cylinder. The mold moving mechanism can include a plurality of drive systems such as a coarse motion drive system and a fine motion drive system to accurately locate the mold 3. Further, the mold moving mechanism can move the mold 3 not only in the Z axis direction but also in the X axis direction and the Y axis direction. Furthermore, the mold moving mechanism can have a tilt function for adjusting a position of the mold 3 in a θ (rotation about the Z axis) direction and a tilt of the mold 3.

Mold correction units 11 (deformation units) are disposed around the mold 3 held by the mold holding unit 4. The mold correction units 11 apply forces to a side surface of the mold 3 to deform the mold 3 in a direction along an XY plane of a pattern portion 3a. FIG. 2 is a plan view illustrating the mold correction units 11 in a case where the mold 3 and the mold correction units 11 are viewed from below (−Z axis direction). In an example of FIG. 2, a plurality of mold correction units 11 is disposed to surround an outer peripheral portion of the mold 3 held by the mold holding unit 4. Further, the plurality of mold correction units 11 applies forces to the side surface of the mold 3 to correct a shape of the pattern portion 3a of the mold 3. Thus, the shape of the pattern portion 3a of the mold 3 matches a shape of a shot region of the substrate 5. In the example of FIG. 2, the plurality of mold correction units 11 applies forces in a direction from four side surfaces of the mold 3 to the inside of the mold 3. However, the plurality of mold correction units 11 does not always have to apply the forces from the four directions, and thus can apply the forces from at least two different directions. Further, in the example of FIG. 2, the sixteen mold correction units 11 are disposed around the mold 3. However, the number of the mold correction units 11 is not limited to sixteen and can be changed based on the shape of the pattern portion 3a of the mold 3 or target accuracy.

The mold 3 has, for example, a rectangular outer periphery. The mold 3 includes the pattern portion 3a having a pattern formed three-dimensionally on a second surface 3b (a projection-and-recess pattern such as a circuit pattern to be transferred to the substrate 5). The second surface 3b is on the opposite side of the first surface 3c and opposes the substrate 5 with the mold 3 being held by the mold chuck 12. The mold 3 is configured by a material that enables light to be transmitted, such as quartz. Further, the mold 3 can include a recessed portion 3d (first recessed portion) on the first surface 3c, which is on the opposite side of the second surface 3b. The recessed portion 3d has a circular planar shape and a depth shorter than a distance between the first surface 3c and the second surface 3b.

A mold conveyance unit 8, which is fixed to the bridge surface plate 23, adsorbs to hold the mold 3 and conveys the mold 3. The mold conveyance unit 8 supplies the mold 3 to the mold holding unit 4, and recovers the mold 3 from the mold holding unit 4. The mold conveyance unit 8 includes an arm drive unit (not illustrated), an arm portion (not illustrated) that is driven by the arm drive unit, and a hand portion (not illustrated) that attached to the arm portion to hold the mold 3.

An irradiation unit 2, which is fixed to the bridge surface plate 23, includes a light source (not illustrated) and an irradiation optical system (not illustrated). The irradiation optical system includes a combination of optical elements, described below. The irradiation unit 2 irradiates the imprint material on the substrate 5 with the light 10 (for example, ultraviolet ray) via the mold 3 in imprint processing. The irradiation unit 2 includes the light source, and the optical elements (lens, mirror, light shield plate, etc.) for adjusting a state of light from the light source to a state (light intensity distribution, an illumination region, etc.) of the light 10 suitable for the imprint processing. In the present exemplary embodiment employing the optical-curing method, the imprint apparatus 1 includes the irradiation unit 2. In a case of employing a heat-curing method, the imprint apparatus 1 includes a heat source for curing the imprint material (thermosetting imprint material) instead of the irradiation unit 2.

A substrate stage 6, which is disposed on a base surface plate 24, includes a substrate chuck (not illustrated) and a stage drive mechanism (not illustrated). The substrate stage 6 moves while holding the substrate 5. The substrate chuck attracts to hold the substrate 5 using a vacuum suction force or an electrostatic force. The substrate chuck is mounted onto the stage drive mechanism. The substrate stage 6 is movable in an XY plane. When the pattern portion 3a of the mold 3 is pressed against the imprint material on the substrate 5, the position of the substrate stage 6 is adjusted so that the mold 3 is aligned with the substrate 5. An actuator applicable to the substrate stage 6 includes, for example, a linear motor and an air cylinder. Further, the substrate stage 6 can move the substrate 5 not only in the X axis direction and the Y axis direction but also in the Z axis direction. Pressing and release of the mold 3 in the imprint apparatus 1 are achieved by moving the mold 3 in the Z axis direction. Alternatively, the pressing and release can be achieved by moving the substrate 5 in the Z axis direction. Further, the pressing and release of the mold 3 can be achieved by relatively moving both the mold 3 and the substrate 5 in the Z axis direction. Furthermore, the substrate stage 6 can have a tilt function for adjusting a position of the substrate 5 in the θ (rotation about the Z axis) direction and a tilt of the substrate 5.

Glass, ceramics, metal, an imprint material, or the like is used for the substrate 5. A member made of a material different from the substrate can be formed on a surface of the substrate 5, if necessary. Specifically, the substrate is a silicon wafer, a compound semiconductor wafer, or a glass wafer containing quartz as a material. The substrate can be a glass substrate to be used for manufacturing a replica mask from a master mask in the imprint processing.

A supply unit 7, which is fixed to the bridge surface plate 23, applies the imprint material to the shot region on the substrate 5. The supply unit 7, which employs an ink jet method as a supply method, includes a container (not illustrated) that stores an uncured imprint material. It is desirable that an atmosphere inside the container includes, for example, a slight amount of oxygen. In such a manner, the imprint material can be managed not to be cured. Further, it is desirable that a material of the container is a material in which particles or chemical impurities are not mixed with the imprint material. The supply unit 7 has, for example, a piezo-type discharge mechanism (ink jet head) including a plurality of discharge ports. A supply amount (discharge amount) of the imprint material adjustably ranges from 0.1 pL droplet to 10 pL droplet, and normally about 1 pL droplet in most cases. A total supply amount of the imprint material is determined based on density of the pattern portion 3a and a target residual film thickness. The supply unit 7 applies the imprint material as droplets onto the shot region in a dispersed manner based on an operation command from a control unit 9, described below, to control a supply position and a supply amount.

The control unit 9 is configured by at least one computer including a central processing unit (CPU) and a memory. The control unit 9, which is connected to respective components of the imprint apparatus 1 via a line, controls operations and adjustment of the respective components of the imprint apparatus 1 based on programs stored in the memory. For example, in the present exemplary embodiment, the control unit 9 controls strength of a force of the mold chuck 12 for holding the mold 3, and controls the movements of the mold correction units 11. Further, the control unit 9 can be integral with another unit of the imprint apparatus 1 (inside a common housing), or be independent from another unit of the imprint apparatus 1 (in another housing).

An imprint method (imprint processing) to be performed by the imprint apparatus 1 will be described. First, the control unit 9 causes a substrate conveyance unit (not illustrated) to place the substrate 5 on the substrate stage 6 and fix the substrate 5 thereto. The control unit 9 moves the substrate stage 6 to suitably change the position of the substrate 5. At the same time, the control unit 9 causes an alignment measurement unit (not illustrated) to sequentially measure alignment marks on the substrate 5 and accurately detect the positions of the substrate 5. The control unit 9 then calculates each transfer coordinate based on detection results, and forms a serial pattern on each predetermined shot region based on the calculation results (step-and-repeat processing). As a flow of forming a pattern on a certain one shot region, the control unit 9 first causes the substrate stage 6 to locate the supply position on the substrate 5 (a specific position on the shot region) below the discharge ports of the supply unit 7. Thereafter, the supply unit 7 supplies the imprint material to the shot region on the substrate 5 (supply step). The control unit 9 then causes the substrate stage 6 to move the substrate 5 so that the shot region comes to a pressing position just below the pattern portion 3a. The substrate 5 is positioned in such a manner. The control unit 9 performs alignment between the pattern portion 3a and a substrate-side pattern on the shot region, and correction of the pattern portion 3a using the mold correction units 11. Thereafter, the control unit 9 moves the mold holding unit 4, and presses the pattern portion 3a against the imprint material on the shot region (mold pressing step). The pressing causes the projection-and-recess pattern of the pattern portion 3a to be filled with the imprint material. The control unit 9 determines completion of the pressing using a load sensor, not illustrated, disposed inside the mold holding unit 4. In this state, the irradiation unit 2 irradiates a rear surface (upper surface) of the mold 3 with the light 10 for a predetermined length of time in a curing step. The light 10, which has been transmitted through the mold 3, cures the imprint material. After the curing of the imprint material, the control unit 9 moves the mold holding unit 4 to releases the pattern portion 3a from the substrate 5 (mold releasing step). As a result, a three-dimensional pattern of the imprint material is formed on the surface of the shot region on the substrate 5. The three-dimensional pattern is a copy of the projection-and-recess pattern of the pattern portion 3a. Such a series of the imprint operation is performed more than once while the shot region is being changed by driving the substrate stage 6. Thus, the imprint apparatus 1 can form a plurality of imprint material patterns on one substrate 5.

Figure 9:
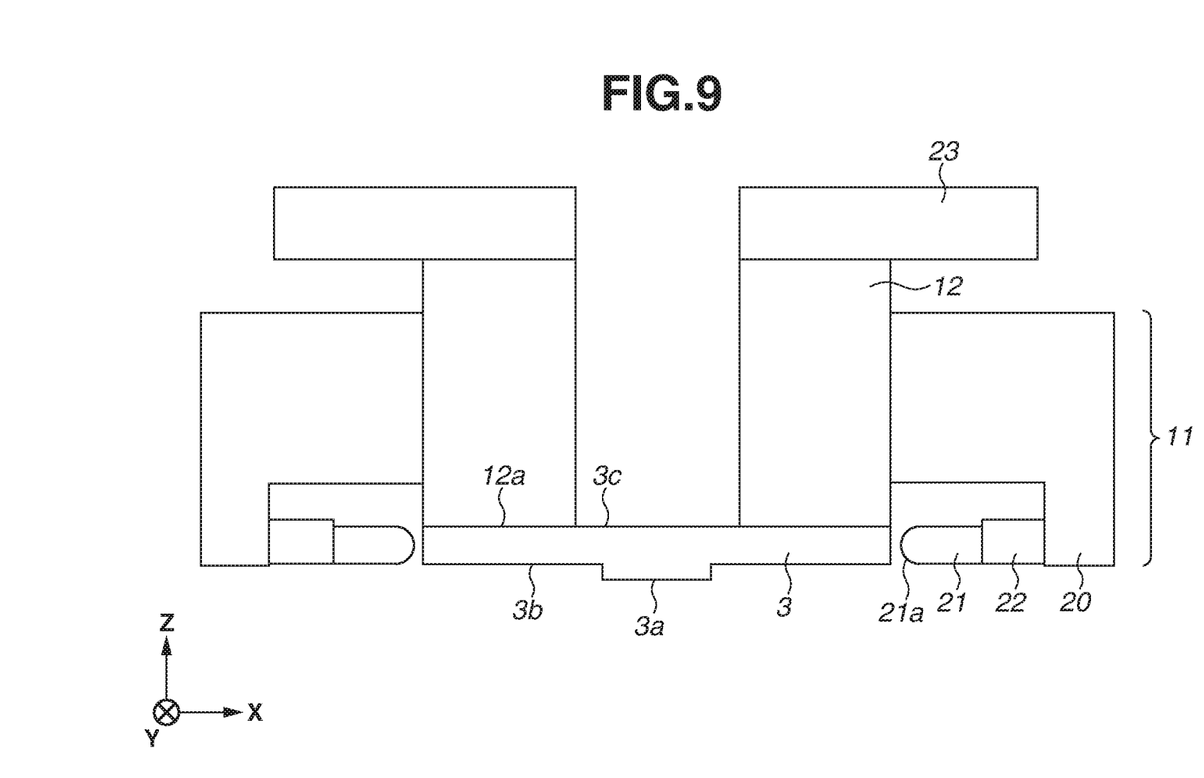
FIG. 9 is a side view illustrating a conventional mold correction unit.

Conventional mold correction units 11 will be described below with reference to FIG. 9. FIG. 9 is a side view illustrating the conventional mold correction units 11. The mold correction units 11 are fixed to support portions 20, respectively. The support portions 20 are fixed to the mold chuck 12. Thus, the mold correction units 11 are disposed around the mold 3 held by the mold chuck 12. The mold correction units 11 each have a contact portion 21 and a correction drive unit 22. The contact portion 21 is disposed to oppose a side surface on an outer periphery of the mold 3 held by the mold chuck 12. The correction drive unit 22 drives the contact portion 21 in a direction along the XY plane. The contact portion 21 driven by the correction drive unit 22 makes contact with the side surface of the mold 3 to apply forces to the mold 3 in the direction along the XY plane. The contact portion 21 has a front end portion 21a that makes contact with the mold 3. In an example of FIG. 9, the front end portion 21a of the contact portion 21 has a hemispherical shape, but the shape is not limited to a hemisphere. Thus, the front end portion 21a can have a three-dimensional aspherical shape such as a cube shape, a conical shape, or a frustum shape. The mold correction units 11 each have a link mechanism so that the correction drive unit 22 can be disposed on an axis different from a motion axis on which the contact portion 21 moves. The correction drive units 22 each can include, for example, a piezoelectric element, a pneumatic actuator, a linear motor, and a cam mechanism.

Figure 10A:
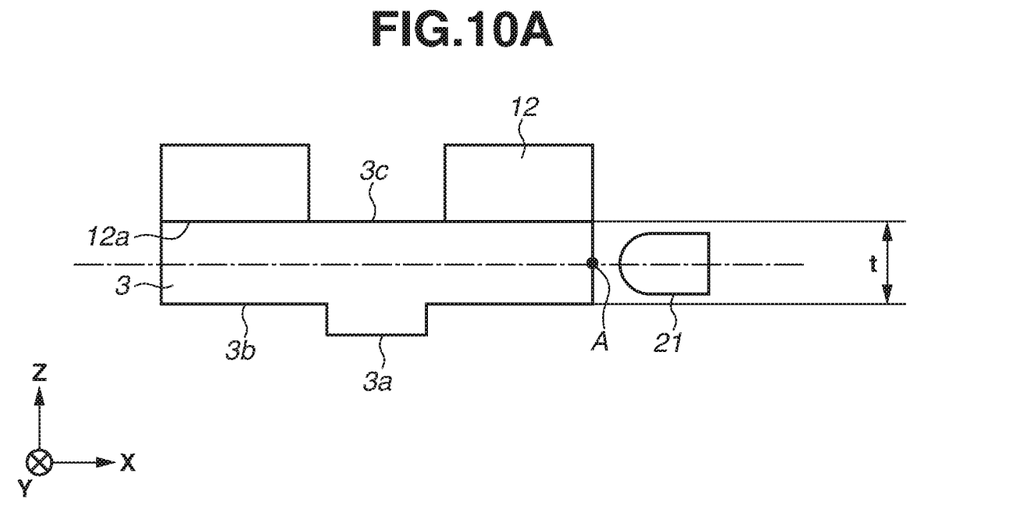
FIGS. 10A and 10B are diagrams each illustrating a position to which the conventional mold correction unit applies a force.
Figure 10B:
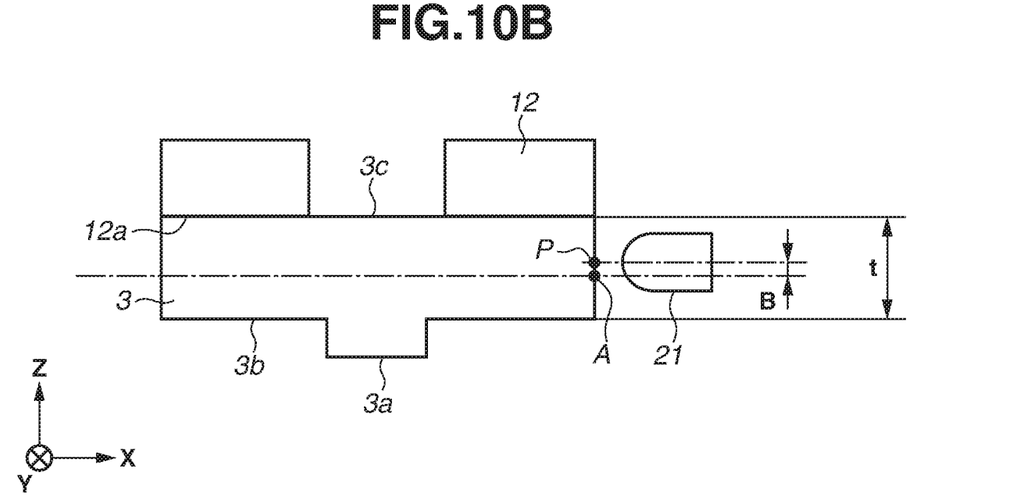
Figure 11A:
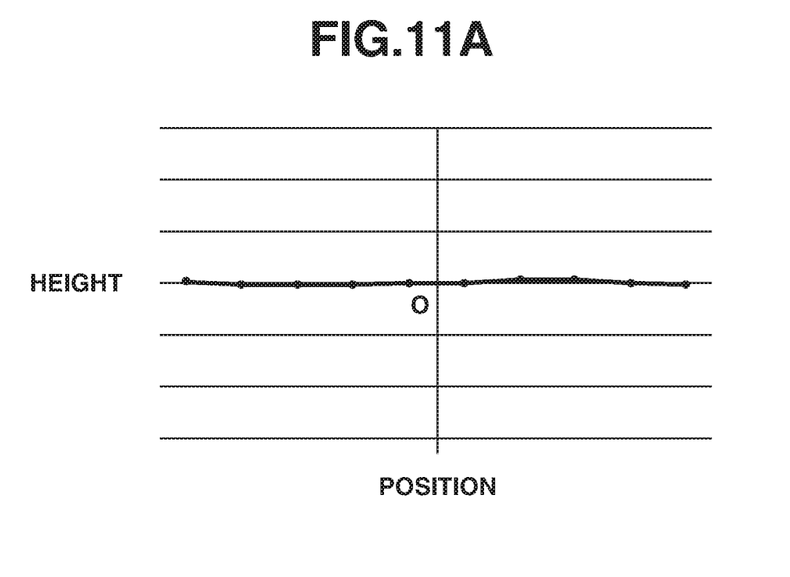
FIGS. 11A and 11B are charts each illustrating a result of measuring a height of a pattern portion of a mold to which the conventional mold correction unit applies a force.
Figure 11B:
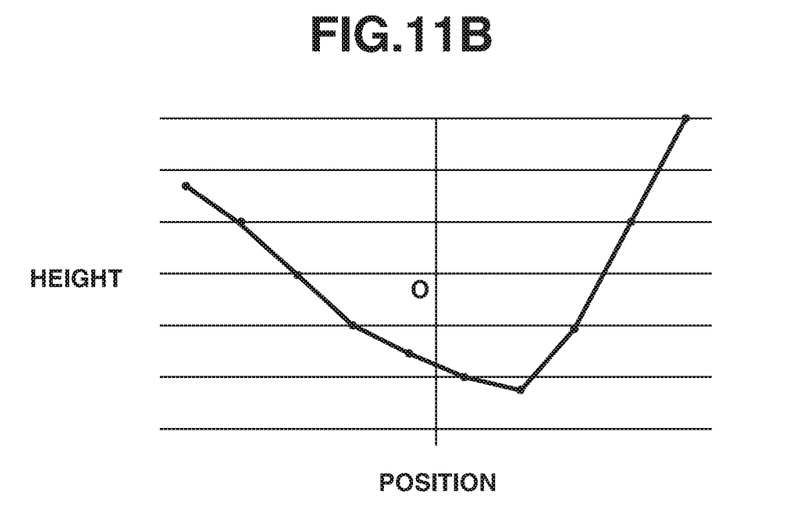

An influence of changes in positions to which the mold correction units 11 (the contact portions 21) apply forces on the side surface of the mold 3 will be described with reference to FIGS. 10A and 10B and FIGS. 11A and 11B. FIGS. 10A and 10B are diagrams each illustrating a position to which the conventional mold correction unit 11 applies a force. In FIGS. 10A and 10B, some components such as the correction drive unit 22 and the support portion 20 of the mold correction unit 11 are omitted. FIGS. 11A and 11B are diagrams each illustrating a result of measuring a height of the pattern portion 3a of the mold 3 to which the conventional mold correction unit 11 applies a force.

In FIGS. 10A and 10B, the mold 3 is held to the holding surfaces 12a of the mold chuck 12. At this time, the mold 3 is held by the mold chuck 12 with the first surface 3c on the opposite side of the mold 3 from the second surface 3b having the pattern portion 3a of the mold 3 making contact with the holding surfaces 12a of the mold chuck 12. A position of the contact portion 21 of the mold correction unit 11 is adjusted so that a force is applied to a predetermined position on the side surface of the mold 3 held by the mold chuck 12. In an example of FIG. 10A, in a case where a thickness t of the mold 3 is a distance between the second surface 3b and the first surface 3c, the position of the contact portion 21 of the mold correction unit 11 is adjusted based on the thickness in design t of the mold 3. As a result, a force is applied to a predetermined position A on the side surface of the mold 3. The predetermined position A can be an intermediate position between the second surface 3b and the first surface 3c on the side surface of the mold 3 held by the mold chuck 12. However, the predetermined position A is not limited to the intermediate position. As the predetermined position A, an optimum position where the shape of the pattern portion 3a is corrected can be obtained in advance by experiment or simulation.

FIG. 11A is a diagram illustrating the result of measuring the height (position in the Z axis direction) of the pattern portion 3a (lower surface) with respect to a position in the direction along the XY plane in a case where a force is applied to the predetermined position A on the side surface of the mold 3. FIG. 11A indicates a position in the direction along the XY plane, and an original point represents a center of the pattern portion 3a. A lateral axis represents the height of the pattern portion 3a, and the original point represents a height to be a reference (reference height) of the pattern portion 3a.

However, the thickness t of the mold 3 might include an error at a time of manufacturing the mold 3, and is thus different from the thickness in design of the mold 3. Due to the influence of the error in the thickness t of the mold 3, the contact portion 21 of the mold correction unit 11 might apply a force to a position shifted from the predetermined position on the side surface of the mold 3 held by the mold chuck 12. In an example of FIG. 10B, in a case where the thickness t of the mold 3 is larger than the thickness in design of the mold 3, the contact portion 21 of the mold correction unit 11 applies a force to a position P shifted from the predetermined position A by a distance B on the side surface of the mold 3. FIG. 11B is a diagram illustrating the result of measuring the height of the pattern portion 3a with respect to the position in the direction along the XY plane in a case where a force is applied to the position P shifted from the predetermined position A on the side surface of the mold 3. A vertical axis and a horizontal axis are as described about them in FIG. 11A. As illustrated in FIG. 11B, in a case where the contact portion 21 of the mold correction unit 11 applies a force to the position P, the pattern portion 3a deflects to be protruded downward (−Z axis direction). Further, in comparison with the result in FIG. 11A, the height of the pattern portion 3a greatly deviates from the reference height. That is, in the case where the force is applied to the position P shifted from the predetermined position A, the force acts on the pattern portion 3a in the height direction of the pattern portion 3a (the Z axis direction). The force to act in the direction along the XY plane reduces, and thus the shape of the pattern portion 3a cannot be accurately corrected.

Figure 3:
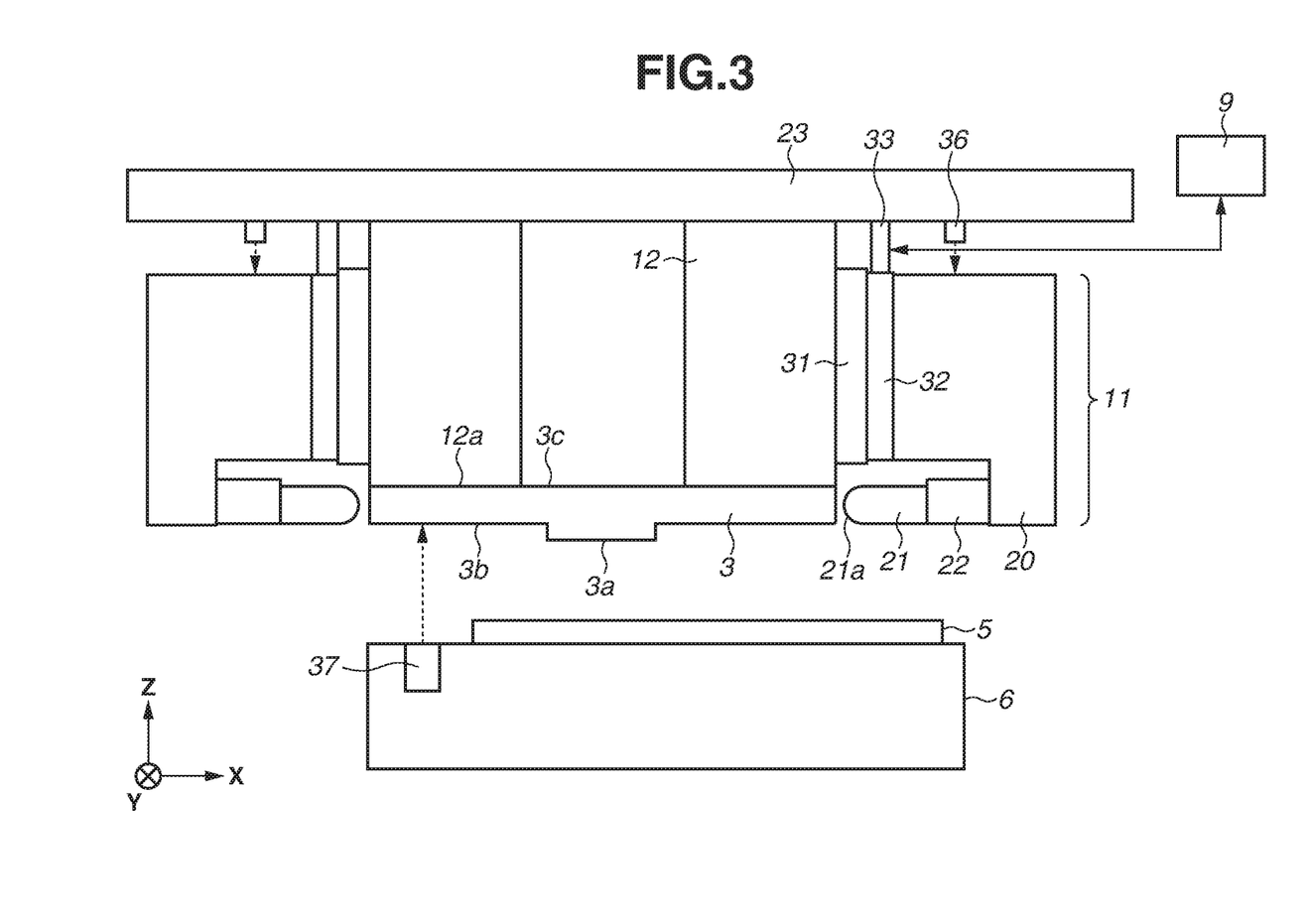
FIG. 3 is a side view illustrating the mold correction units according to a first exemplary embodiment.

Therefore, the imprint apparatus 1 according to the present exemplary embodiment includes means for changing the position where each of the mold correction units 11 applies a force to the mold 3. FIG. 3 is a side view illustrating the mold correction unit 11 according to the present exemplary embodiment. The mold correction unit 11 is fixed to a movable base 32 that is movable in the Z axis direction along a guide portion 31 fixed to the mold chuck 12. Further, first a drive unit 33 drives the movable base 32 in the Z axis direction. The first drive unit 33 includes, for example, a linear motor and a piezoelectric element. As a result, the position of the contact portion 21 of the mold correction unit 11 in the Z axis direction can be changed. Thus, a relative position between the mold 3 held by the mold chuck 12 and the contact portion 21 of the mold correction unit 11 can be changed.

A first measurement unit 36 measures a position of the mold correction unit 11 in the Z axis direction. The control unit 9 changes the position of the contact portion 21 of the mold correction unit 11 in the Z axis direction using a measurement result from the first measurement unit 36. The first measurement unit 36 can include, for example, a spectral interferometer and a laser displacement meter. A second measurement unit 37, which is disposed on the substrate stage 6, measures a height (position in the Z axis direction) of the second surface 3b of the mold 3 held by the mold chuck 12. The second measurement unit 37 can includes, for example, a spectral interferometer and a laser displacement meter. The control unit 9 calculate the thickness t of the mold 3 using the positions of the substrate stage 6 and the mold chuck 12 in the Z axis direction, and a measurement result from the second measurement unit 37. The control unit 9 can obtain the thickness t of the mold 3 measured by an external measurement device (not illustrated). Alternatively, the control unit 9 can cause a measurement unit disposed in a mold conveyance unit (not illustrated) that conveys the mold 3 to the mold chuck 12 to measure the thickness t of the mold 3.

Figure 4A:
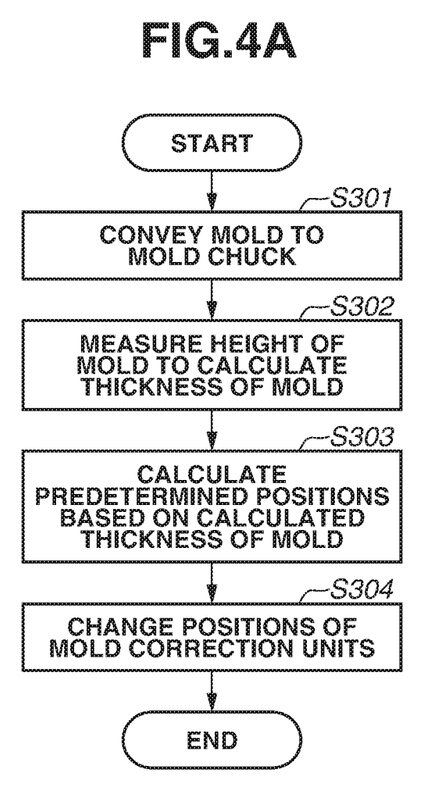
FIGS. 4A and 4B are flowcharts illustrating methods of changing positions of the mold correction units.
Figure 4B:
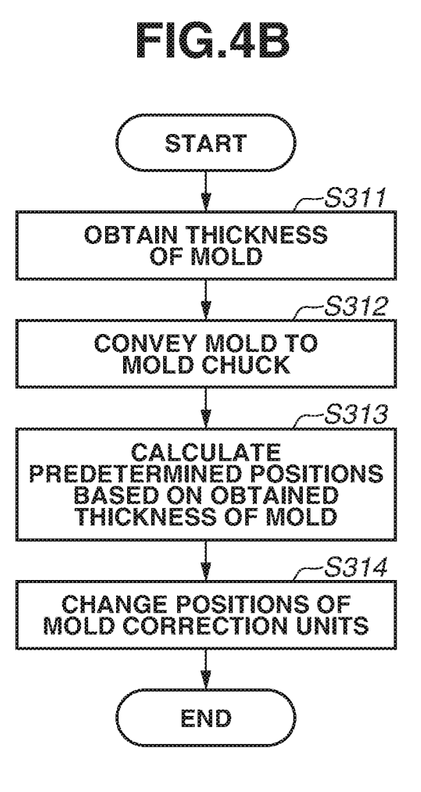

A method of changing positions where the mold correction units 11 according to the present exemplary embodiment apply forces to the mold 3 will be described. FIGS. 4A and 4B are flowcharts each illustrating the method of changing the positions of the mold correction units 11. FIG. 4A is the flowchart illustrating a method of measuring the thickness t of the mold 3 based on the measurement result from the second measurement unit 37. In step S301, the control unit 9 causes the mold conveyance unit 8 to convey the mold 3 to the mold chuck 12. Further, the control unit 9 causes the mold chuck 12 to hold the conveyed mold 3. In step S302, the control unit 9 causes the second measurement unit 37 to measure a height of the second surface 3b of the mold 3. At this time, the control unit 9 stores, in the storage unit, positions of the substrate stage 6 and the mold chuck 12 in the Z axis direction. The control unit 9 can cause the second measurement unit 37 to measure the heights of a plurality of positions on the second surface 3b of the mold 3 by moving at least one of the substrate stage 6 and the mold chuck 12 in the direction along the XY plane. The control unit 9 calculates the thickness t of the mold 3 using the positions of the substrate stage 6 and the mold chuck 12 in the Z axis direction and the measurement result from the second measurement unit 37. In a case where the heights of the plurality of positions on the second surface 3b of the mold 3 are measured, the thickness t of the mold 3 can be calculated by calculating a statistic such as an average value or an intermediate value. In step S303, the control unit 9 calculates predetermined positions to which forces are applied by the mold correction units 11 (the contact portions 21), respectively, based on the calculated thickness t of the mold 3. For example, the predetermined positions can be intermediate positions between the second surface 3b and the first surface 3c of the mold 3, but are not limited to the intermediate positions. The predetermined positions can be determined in advance depending on attributes such as a shape and a material of the mold 3 so that a deflection of the pattern portion 3a in the Z axis direction becomes small. The predetermined positions can be determined by experiment or simulation. Further, the predetermined positions can be calculated based on the position of the mold chuck 12 in the Z axis direction and the measurement result from the second measurement unit 37 without calculating the thickness t of the mold 3. In step S304, the control unit 9 causes the first drive units 33 to move the mold correction units 11 to locate the mold correction units 11 so that the positions of the contact portions 21 in the Z axis direction come to the predetermined positions, respectively.

FIG. 4B is the flowchart illustrating a method with which the control unit 9 obtains information about the thickness t of the mold 3 from an external measurement device. In step S311, the control unit 9 obtains from the external measurement device information about the thickness t of the mold 3 to be conveyed to the mold chuck 12. In step S312, the control unit 9 causes the mold conveyance unit 8 to convey the mold 3 corresponding to the information obtained in step S311 to the mold chuck 12. The control unit 9 causes the mold chuck 12 to hold the conveyed mold 3. In step S313, the control unit 9 calculates the predetermined positions where the mold correction units 11 (the contact portions 21) apply forces, based on the position of the mold chuck 12 in the Z axis direction and the obtained information about the thickness t of the mold 3. Alternatively, the control unit 9 can calculate the height of the second surface 3b of the mold 3 based on the information about the thickness t of the mold 3 and the position of the mold chuck 12 in the Z axis direction to calculate the predetermined positions. In step S314, the control unit 9 causes the first drive units 33 to move the mold correction units 11 to change the positions of the mold correction units 11 so that the positions of the contact portions 21 in the Z axis direction come to the predetermined positions, respectively.

Figure 5:
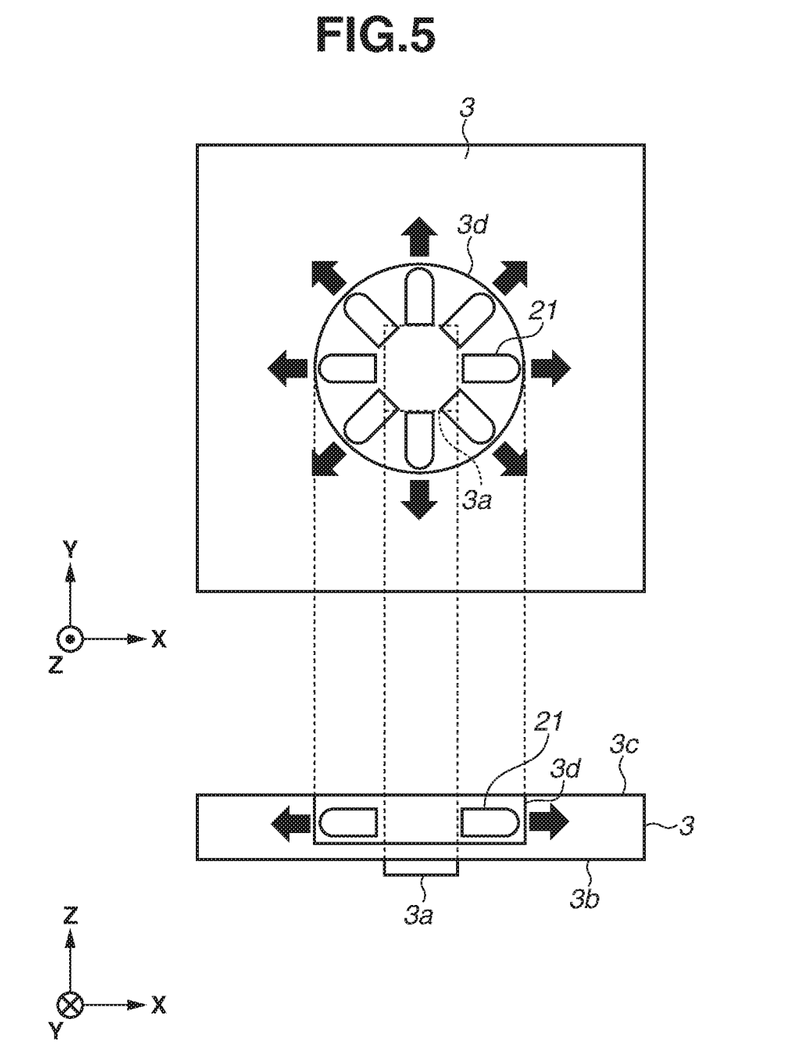
FIG. 5 is a diagram illustrating the mold correction units according to a first modification.

The example of the configuration where the mold correction units 11 apply forces to the side surface on the outer periphery of the mold 3 has been described above. However, the positions to which the forces are applied are not limited to the positions on the side surface of the mold 3. FIG. 5 is a diagram illustrating the mold correction units 11 according to a first modification. In the first modification illustrated in FIG. 5, the mold correction units 11 apply forces to the side surface of the recessed portion 3d including the center of the first surface 3c of the mold 3. At this time, the forces are applied toward the outside of the mold 3. In this case, the plurality of contact portions 21 is disposed inside the recessed portion 3d so that forces are applied toward the outside of the mold 3 in a direction along the first surface 3c. Further, the control unit 9 changes the positions of the mold correction units 11 to cause the contact portions 21 to apply forces to the predetermined positions on the side surface of the recessed portion 3d in the Z axis direction.

Figure 6:
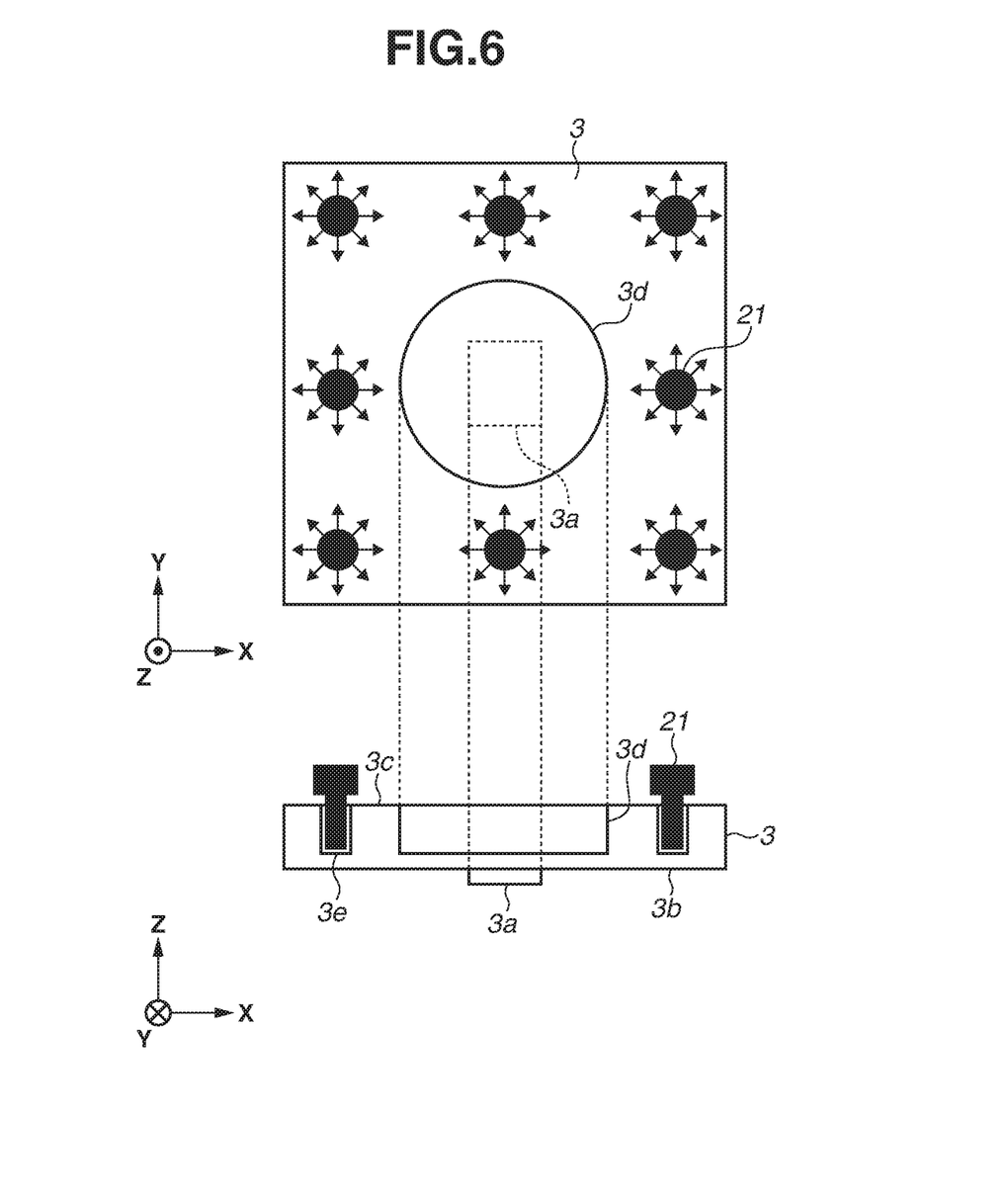
FIG. 6 is a diagram illustrating the mold correction units according to a second modification.

FIG. 6 is a diagram illustrating the mold correction units 11 according to a second modification. In the second modification illustrated in FIG. 6, the mold correction units 11 apply forces to the side surfaces of recessed portions 3e (second recessed portions) disposed around the recessed portion 3d on the first surface 3c of the mold 3. At this time, the forces are applied in any directions along the first surface 3c. In the example of FIG. 6, the eight recessed portions 3e are disposed, but the number of the recessed portions 3e is not limited to eight. Alternatively, only the recessed portions 3e can be disposed without disposing the recessed portion 3d.

The contact portions 21 are disposed to be inserted into the recessed portions 3e, respectively, so that the contact portions 21 independently apply force in any directions along the first surface 3c. That is, the directions where each of the contact portions 21 applies a force can vary among the plurality of recessed portions 3e, or can be identical on at least two of the recessed portions 3e. The control unit 9 changes the positions of the mold correction units 11 so that each of the contact portions 21 applies a force to the predetermined position on the side surface of the recessed portion 3d in the Z axis direction. Further, the mold correction units 11 each may have a combination of the contact portions 21 illustrated in at least two of FIG. 3, FIG. 5, and FIG. 6.

The control unit 9 performs the method illustrated in FIG. 4A or the method illustrated in FIG. 4B, but the present invention is not limited to this manner. For example, the method illustrated in FIG. 4A and the method illustrated in FIG. 4B can be switched to be performed based on a setting saved in the storage unit.

As described above, in the imprint apparatus 1 according to the present exemplary embodiment, the positions of the mold correction units 11 are changed so that the mold correction units 11 apply forces to the predetermined positions of the mold 3. Thus, the shape of the mold 3 can be corrected more accurately.

Figure 7:
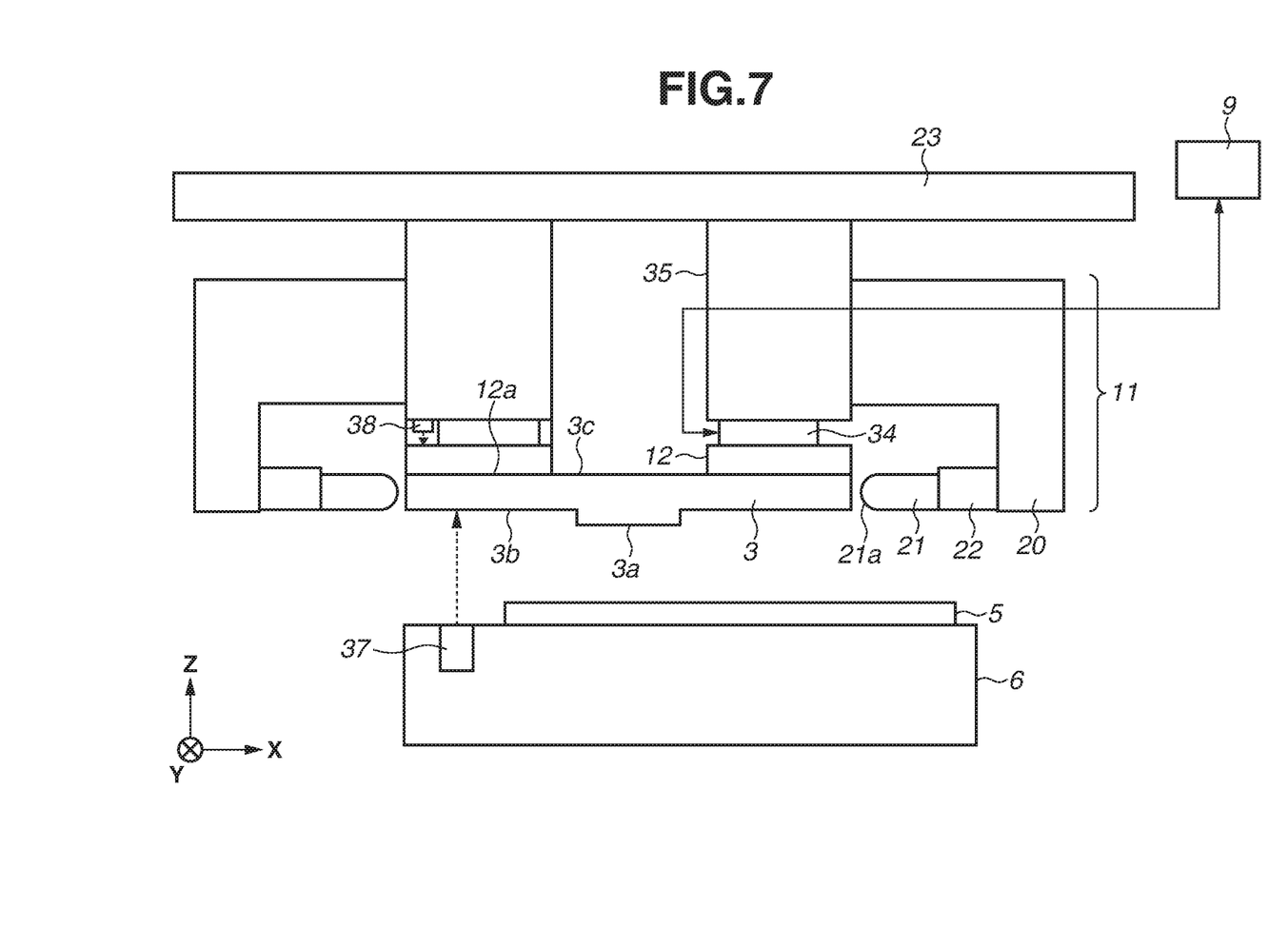
FIG. 7 is a side view illustrating the mold correction units according to a second exemplary embodiment.

The imprint apparatus 1 according to a second exemplary embodiment will be described. The matters that are not described here follow the matters in the first exemplary embodiment. FIG. 7 is a side view illustrating the mold correction units 11 according to the present exemplary embodiment. In the present exemplary embodiment, the mold chuck 12 is moved so that the position of the contact portion 21 of the mold correction unit 11 is aligned with the predetermined position.

The mold correction unit 11 according to the present exemplary embodiment is fixed to a fixing base 35 fixed to the bridge surface plate 23. The mold chuck 12 that holds the mold 3 is connected to the fixing base 35 via a second drive unit 34 fixed to the fixing base 35. The second drive unit 34, which is disposed between the fixing base 35 and the mold chuck 12, moves the mold chuck 12 in the Z axis direction. The second drive unit 34 includes, for example, a linear motor and a piezoelectric element. The second drive units 34 can change the position of the mold 3 held by the mold chuck 12 in the Z axis direction, and a relative position between the mold 3 held by the mold chuck 12 and the contact portion 21 of the mold correction unit 11.

A third measurement unit 38 measures the position of the mold chuck 12 in the Z axis direction. The control unit 9 changes the position of the mold 3, held by the mold chuck 12, in the Z axis direction using the measurement result from the third measurement unit 38. The third measurement unit 38 includes, for example, a spectral interferometer and a laser displacement meter.

In such a configuration, the control unit 9 causes the second drive unit 34 to move the mold chuck 12 (the mold 3) to change the position of the mold chuck 12 (the mold 3) so that the position of the contact portion 21 in the Z axis direction come to the predetermined position. That is, in steps S304 and S314 in FIGS. 4A and 4B, the control unit 9 changes the positions of the mold correction units 11, but in the present exemplary embodiment, the control unit 9 changes the positions of the mold chucks 12.

As described above, in the imprint apparatus 1 according to the present exemplary embodiment, the positions of the mold chucks 12 are changed so that the mold correction units 11 apply forces to the predetermined positions of the mold 3. Thus, the shape of the mold 3 can be corrected more accurately.

<Article Manufacturing Method>

A pattern of a cured material obtained by using the imprint apparatus 1 is permanently used at least partially for various articles, or is used temporarily when various articles are manufactured. The articles include an electric circuit element, an optical element, a micro-electromechanical system (MEMS), a recording element, a sensor, or a mold. Examples of the electric circuit element include a volatile or nonvolatile semiconductor memory, such as dynamic random access memory (DRAM), a static random access memory (SRAM), a flash memory, and a magnetic random access memory (MRAM), and a semiconductor element, such as a large scale integrated circuit (LSI), a charge-coupled device (CCD), an image sensor, and a field-programmable gate array (FPGA). Examples of the mold includes a mold for imprint.

The pattern of the cured material is directly used as at least some configurational members of the above-described articles, or is temporarily used as a resist mask. After etching or ion implantation is performed in a substrate processing step, the resist mask is removed.

Figure 8A:
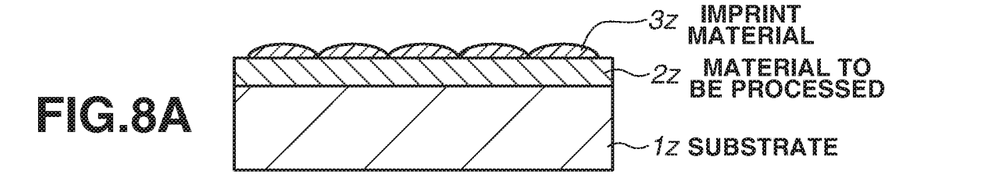
FIGS. 8A, 8B, 8C, 8D, 8E and 8F are diagrams describing an article manufacturing method.

The specific article manufacturing method will be described. As illustrated in FIG. 8A, a substrate $1z$, such as a silicon wafer, having a material to be processed $2z$, such as an insulating material, formed on the surface of the substrate $1z$, is prepared. Thereafter, an imprint material $3z$ is supplied to the surface of the material to be processed $2z$ by the ink jet method. Herein, the imprint material $3z$ which becomes a plurality of droplets is supplied onto the substrate $1z$.

Figure 8B:
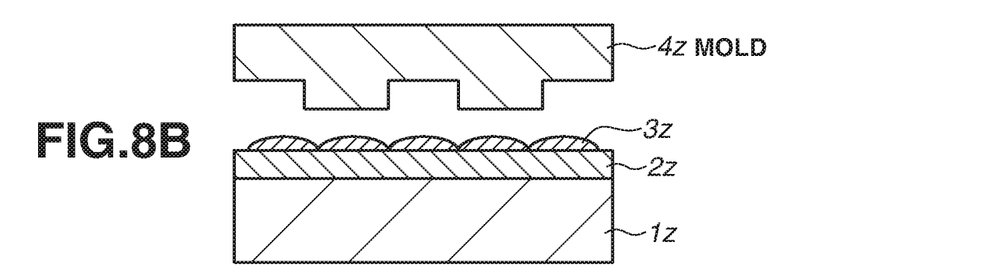
Figure 8C:
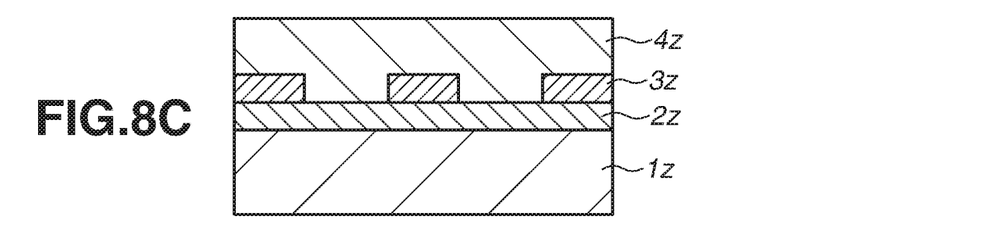

As illustrated in FIG. 8B, an imprint mold $4z$ is disposed with a side having the projection-and-recess pattern opposes the imprint material $3z$ on the substrate. As illustrated in FIG. 8C, the substrate $1z$ to which the imprint material $3z$ is supplied is brought into contact with the mold $4z$, and a pressure is applied to them. The imprint material $3z$ is filled into a gap between the mold $4z$ and the material to be processed $2z$. When the imprint material $3z$ in this state is irradiated with light as curing energy through the mold $4z$, the imprint material $3z$ is cured.

Figure 8D:
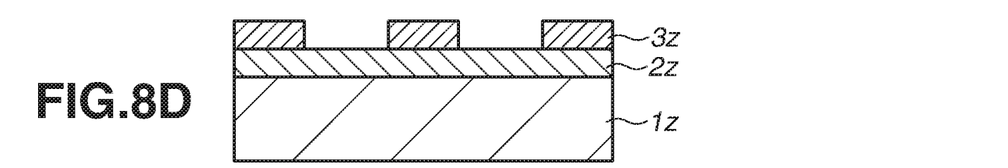

As illustrated in FIG. 8D, after the imprint material $3z$ is cured, the mold $4z$ and the substrate $1z$ are released from each other. As a result, a pattern of the cured material of the imprint material $3z$ is formed on the substrate $1z$. The pattern of the cured material has a shape that recessed portions of mold match protruded portions of the cured material and protruded portions of the mold match recessed portions of the cured material. That is, the projection-and-recess pattern of the mold $4z$ is transferred onto the imprint material $3z$.

Figure 8E:
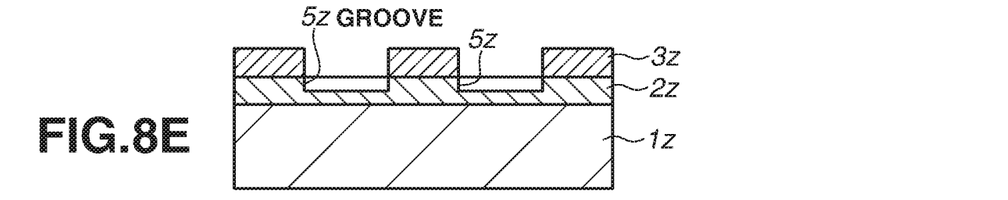
Figure 8F:
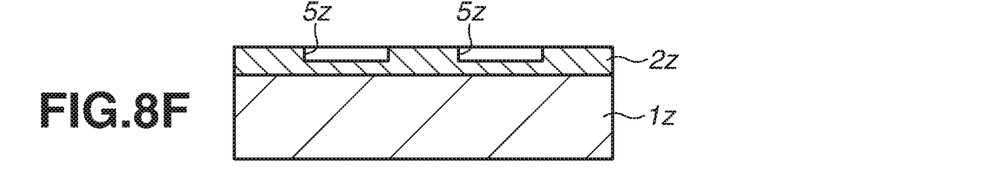

As illustrated in FIG. 8E, when etching is performed by using the pattern of the cured material as an etching-resistant mask, portions without the cured material or portions where thin cured materials remain are removed from the surface of the material to be processed $2z$. These portions become grooves $5z$. As illustrated in FIG. 8F, when the pattern of the cured material is removed, an article having the grooves $5z$ on the surface of the material to be processed $2z$ can be obtained. Herein, the pattern of the cured material has been removed. Alternatively, the pattern is not removed after the process and can be used, for example, as a film for interlayer insulation included in a semiconductor element, namely, as a configurational member of the article.

The first and second exemplary embodiments can be carried out independently, but further a combination of the first and second exemplary embodiments can be carried out.

The exemplary embodiments of the present invention can provide an imprint apparatus, an imprint method, and an article manufacturing method, enabling correction of a shape of a mold more accurately.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2019-039728, filed Mar. 5, 2019, which is hereby incorporated by reference herein in its entirety.

What is claimed is:

1. An imprint apparatus configured to form a pattern of an imprint material on a substrate using a mold, the imprint apparatus comprising:
   a holding unit configured to hold the mold with a holding surface making contact with a first surface of the mold;
   a deformation unit configured to deform the mold by applying a force to the mold by bring a contact portion into contact with the mold held at the holding surface; and
   a drive unit configured to move at least one of the mold held by the holding unit or the contact portion of the deformation unit in a direction vertical to the holding surface to change a relative position between the mold held by the holding unit and contact portion of the deformation unit in the direction vertical to the holding surface,
   wherein the drive unit changes a position where the contact portion of the deformation unit comes into contact with the mold so as to apply the force to the mold in the direction vertical to the holding surface based on information about a position of a second surface on an opposite side of the first surface of the mold held by the holding unit.

2. The imprint apparatus according to claim 1, wherein the drive unit includes a first drive unit configured to move the deformation unit with respect to the contact portion of the mold held by the holding unit.

3. The imprint apparatus according to claim 1, wherein the drive unit includes a second drive unit configured to move the mold held by the holding unit with respect to the contact portion of the deformation unit.

4. The imprint apparatus according to claim 1, further comprising:
   a measurement unit configured to measure a position of the second surface of the mold held by the holding unit,
   wherein the position where the contact portion of the deformation unit comes into contact with the mold to apply the force to the mold is changed based on the position of the second surface measured by the measurement unit.

5. The imprint apparatus according to claim 1, wherein information about a thickness of the mold is obtained, and the position where the contact portion of the deformation unit comes into contact with the mold to apply the force to the mold is changed based on the position of the second surface obtained based on the information.

6. The imprint apparatus according to claim 1, wherein the deformation unit applies the force to a side surface on an outer periphery of the mold held to the holding surface to deform the mold.

7. The imprint apparatus according to claim 1, wherein the deformation unit applies the force to a side surface of a first recessed portion disposed on the first surface of the mold held to the holding surface to deform the mold.

8. The imprint apparatus according to claim 7, wherein the first recessed portion is disposed to include a center on the first surface of the mold.

9. The imprint apparatus according to claim 1, wherein the deformation unit applies the force to side surfaces of a plurality of second recessed portions disposed on the first surface of the mold held to the holding surface to deform the mold.

10. The imprint apparatus according to claim 9, wherein the deformation unit applies the force to at least one of the plurality of second recessed portions in a direction different from the other second recessed portions to deform the mold.

11. An imprint method of forming a pattern of an imprint material on a substrate using a mold, the imprint method comprising:
holding the mold with a holding surface making contact with a first surface of the mold;
by moving at least one of the mold held by the molding or a contact portion configured to come into contact with the mold to apply a force to the mold in a direction vertical to the holding surface and by thereby changing a relative position between the mold held by the molding and the contact portion in the direction vertical to the holding surface based on information about a height of a second surface on an opposite side of the first surface of the mold held with the holding surface, changing a position where the contact portion comes into contact with the mold to apply the force to the mold in the direction vertical to the holding surface;
determining the mold by bringing the contact portion into contact with the mold held with holding surface and by thereby applying the force to the mold.

12. An article manufacturing method comprising:
holding a mold with a holding surface making contact with a first surface of the mold;
by moving at least one of the mold held by the molding or a contact portion configured to come into contact with the mold to apply a force to the mold in a direction vertical to the holding surface and by thereby changing a relative position between the mold held by the molding and the contact portion in the direction vertical to the holding surface based on information about a height of a second surface on an opposite side of the first surface of the mold held with the holding surface, changing a position where the contact portion comes into contact with the mold to apply the force to the mold in the direction vertical to the holding surface;
determining the mold by bringing the contact portion into contact with the mold held with holding surface and by thereby applying the force to the mold;
forming a pattern of an imprint material on a substrate using the mold;
processing the substrate where the pattern is formed; and
manufacturing an article from the substrate processed in the processing.

* * * * *